United States Patent [19]
Davis et al.

[11] Patent Number: 4,725,774
[45] Date of Patent: Feb. 16, 1988

[54] INTEGRATED INTERFEROMETRIC ACOUSTO-OPTIC SPECTRUM ANALYZER

[75] Inventors: Richard L. Davis, Redondo Beach; Harold M. Stoll, Rancho Palos Verdes, both of Calif.

[73] Assignee: Northrop Corporation, Hawthorne, Calif.

[21] Appl. No.: 876,952

[22] Filed: Jun. 20, 1986

[51] Int. Cl.$^4$ .............................................. G01R 23/16
[52] U.S. Cl. ................................. 324/77 K; 350/96.11
[58] Field of Search ........ 324/77 K; 350/358, 162.15, 350/371, 96.11, 96.12, 96.13, 96.14

[56] References Cited

U.S. PATENT DOCUMENTS

| 4,253,060 | 2/1981 | Chen | 324/77 K |
| 4,644,267 | 2/1987 | Tsui et al. | 324/77 K |

OTHER PUBLICATIONS

A Folded-Type IOSA Using Butt-Coupled Chirped Grating Lenses, T. Suhara et al., IEEE J. of Quantum Elect., vol. QE-18, No. 7, Jul. 1982.
Integrated Astable Multivib. Using Mz Interferometric Optical Switches, H. Ito et al., Elect. Letters, Jul. 17th, 1980, vol. 16, No. 15.
Mz Waveguide Modulators in Ti-Diffused LiNbO$_3$, R.
Keil et al., Siemens Forsch J. Entwickl-Ber Bd. 9 (1980), Nr. 1.

Primary Examiner—Stewart J. Levy
Assistant Examiner—Louis M. Arana
Attorney, Agent, or Firm—Terry J. Anderson; Robert B. Block

[57] ABSTRACT

Described herein is an integrated acousto-optic circuit for analyzing the spectrum of a radar signal. A waveguided optical beam is first split into two parts, one of which interacts with a surface acoustic wave generated by a reference signal and the second of which interacts with a surface acoustic wave generated by the signal to be analyzed. The two resulting phase-modulated optical waves then are recombined, Fourier transformed by a lens and finally caused to impinge on an array of photodetectors. The array of detectors is arranged so that each element of the array responds to the combination of one component of the time-varying signal to be analyzed and one component of the time-varying reference signal, that response being an output signal at some preselected radio frequency which is proportional to the amplitude of the frequency component of the radar signal to be analyzed. The several optical components are disclosed as formed on a single substrate integrated optical circuit.

4 Claims, 7 Drawing Figures

INTEGRATED INTERFEROMETRIC ACOUSTO-OPTIC SPECTRUM ANALYZER

BACKGROUND OF THE INVENTION

This invention pertains to devices for analyzing the frequency spectrum of radar signals. More generally, this invention pertains to devices which use acousto-optic techniques for spectrum analysis.

Acousto-optic devices have been used in the prior art for the interferometric analysis of the frequency spectrum of radar signal. FIG. 1 depicts such a prior art device made of discrete optical components. In the prior-art device, laser 1 generates radiation at optical frequencies, which radiation passes through lenses 2 and 3, which lenses serve to expand and collimate the beam of optical radiation. The collimated beam 4 which emerges from lens 3 then passes through cylindrical lens 5 which serves to focus the beam along a line in the Bragg cells 9 and 12. Beam 4 is split into first and second parts by beam splitter 6. The first part 7 of the beam is reflected by mirror 8 through optical Bragg cell 9. A time-varying reference signal, which typically is a chirped sinusoid (i.e., one that is scanned linearly with time through the frequency range over which the signal is to be analyzed) is applied to Bragg cell 9 so as to create an acoustic signal which propagates through the cell transversely to beam 7. The acoustic wave in cell 9 then interacts with beam 7 and phase modulates the wavefront of beam 7. The second part 10 of the beam produced by beam splitter 6 is reflected by mirror 11 into Bragg cell 12. The time-varying signal to be analyzed is introduced as an acoustic wave in cell 12. The acoustic wave travels transversely to beam 10 and phase modulates the wavefront of beam 10. Parts 7 and 10 of the beam are then recombined by combiner 13.

The phase modulation of parts 7 and 10 of the beam by Bragg cells 9 and 12 produces beams propagating in slightly different directions from that of the unmodulated components. The differences in the directions are dependent upon the frequencies of the modulating signals applied to the Bragg cells. The modulated components of the combined parts of the beam then pass through lens 16 whose position and focal length are selected so as to effect the Fourier transform of the modulated components at the point where the latter impinge on the array of photo detectors 14. Cylindrical lens 15 focuses the transformed components on the array.

The wavefront of part 7 of the beam, after modulation in cell 9, after reflection and combination by combiner 13, and after transformation by lens 16 provides a reference signal at optical frequencies in each of the elements of array 14. This reference signal then interacts or mixes with the component of part 10 of the beam that has passed through cell 12 so as to translate the optical frequencies in part 10 to relatively low frequencies to which each detector can respond. The responses of the individual detectors in the array then represent the frequency components of the signal applied to cell 12.

Although such an interferometric acousto-optic spectrum analyzer has been fabricated and operated using discrete optical components, such a device is a bulky construction, highly sensitive to mechanical vibrations and mechanical distortions, thus limiting the usefulness of the prior art device.

SUMMARY OF THE INVENTION

In the present invention, the spectrum analyzer is realized in a single substrate with the exceptions of the source of the optical energy and the array of detectors. Fabrication on a single substrate reduces the size of the analyzer and its sensitivity to mechanical vibrations by many orders of magnitude.

In this invention, the optical radiation modulated by the radar signal propagates along a planar waveguide at the surface of the substrate. Waveguide gratings are used to split, combine and deflect the beams. Surface acoustic wave transducers are used to produce surface waves which phase modulate the optical beams at reference and signal frequencies. A collimating lens and a Fourier transform lens are fabricated on the surface of the substrate to complete the integrated-optic analyzer.

DESCRIPTION OF THE PREFERRED EMBODIMENT

Figure 1:
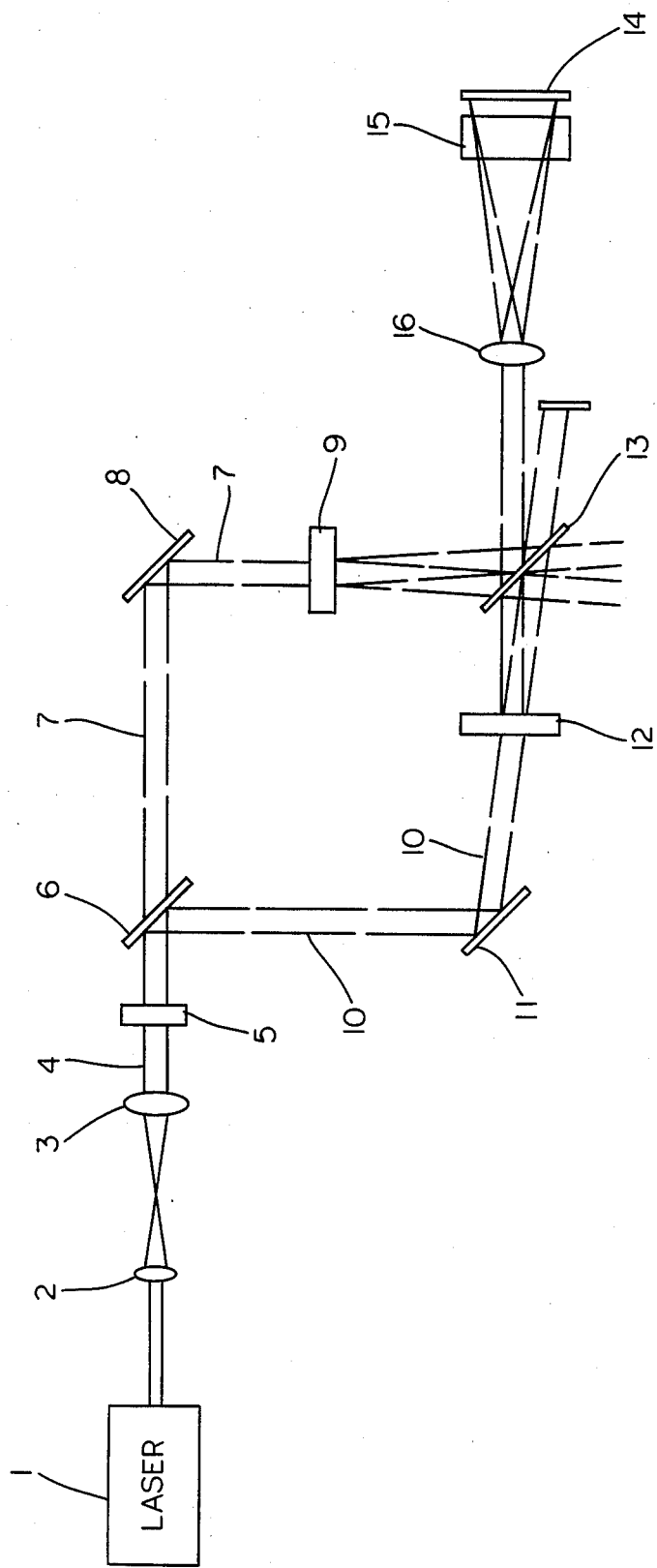
FIG. 1 depicts a prior art interferometric, acousto-optical spectrum analyzer using discrete components.
Figure 2:
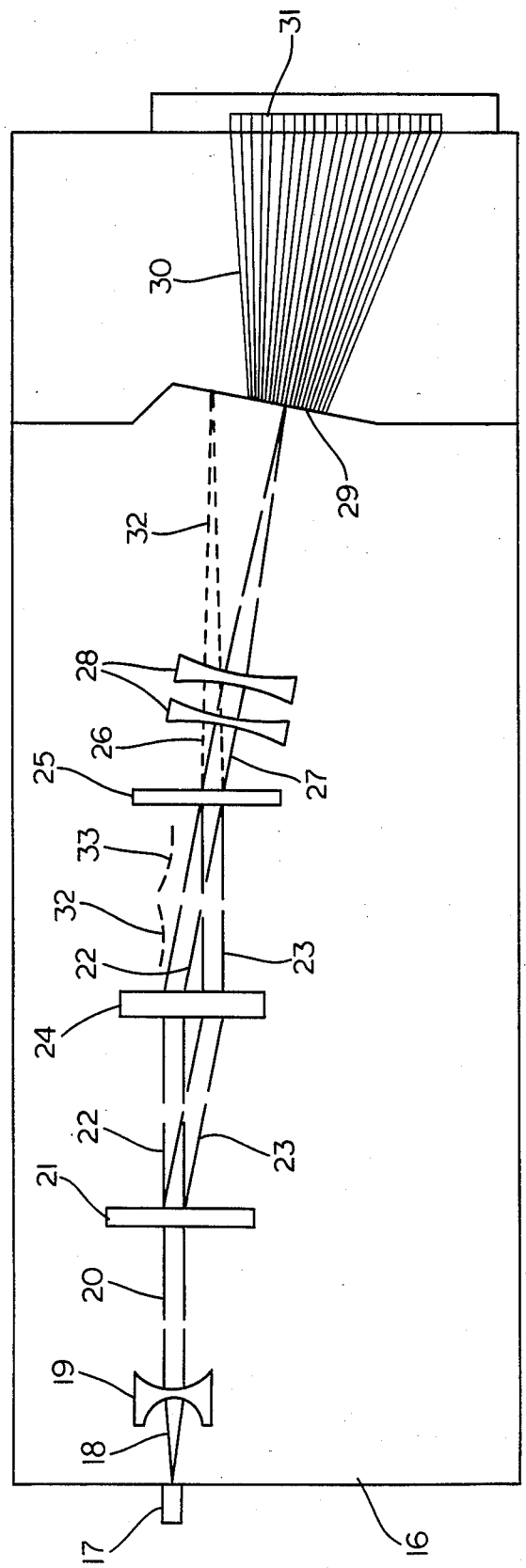
FIG. 2 is a schematic representation, in plan view, of an integrated interferometric acousto-optic spectrum analyzer of the present invention constructed on a single substrate.

Referring now to FIG. 2, the various elements of the invention are shown as fabricated on or in the surface layer of substrate 16 of lithium niobate.

A gallium aluminum arsenide (GaAlAs) laser 17 is butt-coupled to a waveguide on the surface of substrate 16 and emits a slightly divergent beam of light 18 into the planar waveguide along the surface where it is collimated by a collimating lens 19 into a collimated beam 20. Methods for fabricating lens 19 are described in a copending patent application filed in the names of Harold M. Stoll and Richard L. Davis filed concurrently herewith, entitled "Refractive Integrated Optical Waveguide Interface and Lens," and also by Zang De Yu in "Waveguide Optical Planar Lenses in LiNbO$_3$—Theory and Experiments," Opt. Comm., Vol 47, No. 6, pp. 248-250 (Sept. 15, 1983). Beam 20 then passes through Bragg diffraction grating 21 which splits beam 20 into an undiffracted beam 22 and diffracted beam 23. Diffusion grating 21 comprises a plurality of periodically spaced waveguide perturbations such as a plurality of equally spaced grooves. Beams 22 and 23 are each then deflected by Bragg diffraction grating 24 and recombined in Bragg diffraction grating 25.

A group of three or four surface acoustic wave transducers, the combination of which are referred to here as the signal Bragg cell 32, are located on the surface of substrate 16 between diffraction gratings 24 and 25 and are oriented so as to produce surface acoustic waves which interact with beam 23. The signal to be analyzed is applied to this Bragg cell. The surface acoustic waves in Bragg cell 32 phase-modulate the wave front of beam 23, and as a consequence, generate a complex guided beam whose components propagate in directions which correspond to the various spectral components of the surface acoustic wave. Each of the three of four surface acoustic wave transducers has a slightly different spacing between its transducer elements and is oriented at a slightly different angle with respect to beam 23 in order to optimize the interaction of the surface wave it produces with the optical beam. By using a group of such surface acoustic wave transducers, each member of which has a slightly different spacing between its transducer elements, a wider operational bandwidth can be achieved than can be achieved by a single transducer.

A second group of three of four surface acoustic wave transducers, referred to here as the reference Bragg cell 33, also is fabricated on the surface of substrate 16 between diffraction gratings 24 and 25, and is oriented so as to phase modulate the wavefront of beam 22. A time-varying reference signal is applied to the reference Bragg cell. The phase modulation of beam 22 produces an angular spectrum of guided beams propagating in slightly different directions in accordance with the spectrum of the reference signal. The individual transducers within reference Bragg cell 33 also have slightly different spacings between their elements and slightly different orientations so as to operate, as in the case of the signal Bragg cell, over an enhanced bandwidth.

The various components of beams 22 and 23, after interaction with the signals applied to signal Bragg cell 32 and to reference Bragg cell 33 are combined in diffraction grating 25. The combined beams 22 and 23 then emerge from diffraction grating 25 as beams 26 and 27. Lens 28, which lens, in the preferred embodiment comprises two adjacent lenses, produces the Fourier transform of beam 27 at the interface 29 between the planar waveguide at the surface of substrate 16 and an array of channel waveguides 30. The array of channel waveguides 30 function to "fan out" or spread out the various components of beam 27 that are incident upon interface 29 so as to guide these individual components along the channel waveguides to an array of detectors 31. A method for fabricating the array of channel waveguides and the interface 29 between the channel waveguides and the planar waveguide is also described by us in a patent application in the names of Harold M. Stoll and Richard L. Davis entitled "Refractive Integrated Optical Waveguide Interface and Lens" filed concurrently herewith.

Array 31 is a linear array of photodetectors each of which is butt-coupled to the edge of substrate 16. Array 31 is located so that each channel waveguide couples to one photodetector in the array. By driving reference Bragg cell 33 by a signal having an appropriate periodic linear-frequency chirp, the Fourier transform of beam 27 produces at interface 29 an array of local oscillator "spots", with a "spot" appearing at each entrance to a channel waveguide. Each such local oscillator "spot" has an optical frequency slightly different from that of the "spot" at neighboring channels. Each oscillator "spot" combines with the respective component of the Fourier transform of beam 23 which has been modulated by signal Bragg cell 32. The respective component and the oscillator "spot" at each channel then propagate along the channel from interface 29 to the corresponding detector in array 31. In the corresponding detector, the oscillator "spot" then operates as a local oscillator to allow detection within the photoelectric detector of the corresponding component of beam 23. As a consequence, the outputs of the elements of array 31 correspond to the spectral components of the signal applied to signal Bragg cell 32. The invention thus operates to produce signals from the array of detectors which signals represent the spectral components of the signal applied to signal Bragg cell 32. Thus, the invention operates as a spectrum analyzer.

With the exception of the laser and the detector array, all device components are designed to be fabricated on a common substrate 16 using batch, planar processing techniques in order to maximize yield and reproducibility and to minimize cost. The device substrate consists of a block of crystalline $LiNbO_3$ chosen because of its low SAW attention coefficient and high piezoelectric and elasto-optic coefficients. The optical waveguiding structure, within which all signal processing is performed, is fabricated by immersing a titanium-indiffused $LiNbO_3$ substrate in a weak acid, thereby causing partial exchange of $Li^+$ with $H^+$ (proton exchange) and an elevation ($\Delta n_e \sim 0.12$) in the refractive index of the substrate.

The wide-bandwidth SAW transducer arrays consist of interdigitated aluminum electrode patterns evaporatively deposited directly onto the waveguide surface. The waveguide lenses are appropriately configured regions of high and low refractive index. (The different TIPE refractive indices are realized by controlling the acidity, temperature and the duration of the proton exchange process.) The beam splitter, deflectors, and combiner are constant-period gratings which have been tailored to perform specific functions by adjusting their respective interaction lengths and grating coupling coefficients. The waveguide fanout is an array of channel waveguides formed by proton exchange.

The GaAlAs laser and the detector array are attached to the main $LiNbO_3$ crystal separately. Such a hybrid approach is necessitated by the nonavailability of a material system capable of both monolithic integration and attainment of the stated device performance goals. Since the laser and the detector array involve material systems and device technologies which are not common to the basic $LiNbO_3$ structure to be described here, these devices will henceforth be treated simply as input-output entities whose performance characteristics and physical dimensions may be assumed.

We now describe the spectrum analyzer components including the optical waveguiding structure, the collimating and Fourier transform lenses, and the grating elements.

Waveguides are fabricated on the surface of Y-cut $LiNbO_3$ using the method of titanium indiffusion followed by proton exchange (TIPE). The proton exchange is typically performed at low temperatures (200°–250° C.) in benzoic acid. Using this process, arbitrary surface refractive index elevations, $\Delta n$, approaching 0.13 (for TE modes at 633 nm) may be obtained by varying the extent to which the $H^+$ from the acid replaces the $Li^+$ in the $LiNbO_3$. The latter is most easily achieved by buffering the benzoic acid with lithium benzoate.

TIPE waveguide technology is key to the interferometric spectrum analyzer design for several reasons. A large $\Delta n$ allows both for the fabrication of high performance refractive lenses and for low-loss, off-axis propagation of TE-polarized waveguide modes. The latter is important because of the enhanced acousto-optic interaction efficiencies which can be realized using TE modes. By binding the guided optical mode more tightly to the substrate surface, the large $\Delta n$ associated with TIPE waveguides also provides for more efficient laser-to-waveguide coupling and for larger grating-element deflection angles. This is important in order to keep the substrate size to a minimum.

Figure 3:
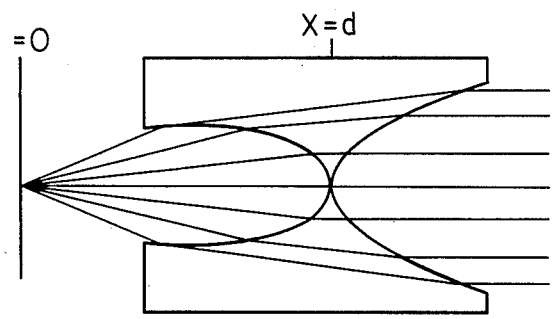
FIG. 3 is a more detailed view of the collimating lens of FIG. 2.

The spectrum analyzer collimating lens is a two-surface, homogeneous-index refractive lens. FIG. 3 shows an enlargement of the lens with several rays traced through its center. Referring back to FIG. 2, it is noted that the majority of the optical path with the spectrum analyzer is immersed in a high-$\Delta n$ waveguide. The lenses (both collimating and Fourier transform) then become regions of reduced guided mode index bounded by concave surfaces.

Figure 4:
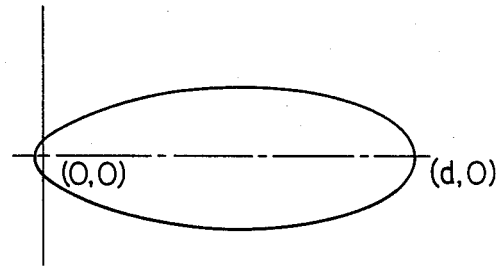
FIG. 4 is a diagram of psuedo ellipse defined by the equation controlling the collimating lens.

Since the collimating lens is required only to image a point source at infinity, Huygen's principle may be applied to derive the shapes of the lens surfaces. The design shown in FIG. 3 utilizes two surfaces with equal refracting power. For a point source (laser diode) located at the origin, the first surface intersects the x-axis at $(d,0)$ and forms a virtual image of the source at $(-d,0)$. This surface is defined by the following expression:

$$\frac{y}{d} = \left[\frac{1}{(n^2-1)^2}\{[2n^2(1+x/d) + 2(1-x/d) - 4n+1]^{\frac{1}{2}} - n(2-n)\}^2 - (x/d)^2\right]^{\frac{1}{2}} \quad (1)$$

where n is the ratio of the refractive index outside the lens to the index within the lens. The curve defined by Equation (1) is a psuedo-ellipse; a complete closed branch is shown in FIG. 4, where it has been assumed that $n=1.046$. This is a typical value for the selected materials. The second surface, which also intersects the x-axis at $(d,0)$, is a hyperbola defined by the following expression:

$$\frac{y}{d} = \left\{\left[\left(\frac{x}{d} - \frac{n-1}{n+1}\right)^2 - \left(\frac{2}{n+1}\right)^2\right](n^2-1)\right\}^{\frac{1}{2}} \quad (2)$$

The lens defined by Equations (1) and (2) has an effective, full-aperture focal length of $F=d$ and an equivalent lens speed of f: 1.67.

The Fourier transform lens presents a more complex design exercise in that near-diffraction-limited performance is required over some finite field of view. Since a short focal-length lens is desired for device compactness and since the input optical beam width is fixed, a relatively high speed lens is required. On the other hand, the rather minimal $\Delta n$ available places a lower limit on the lens focal length which can be realized.

Figure 5:
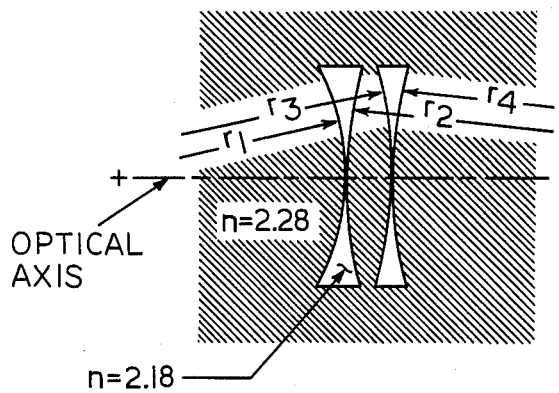
FIG. 5 is a detailed diagram of the Fourier transform lens of FIG. 2.
Figure 6:
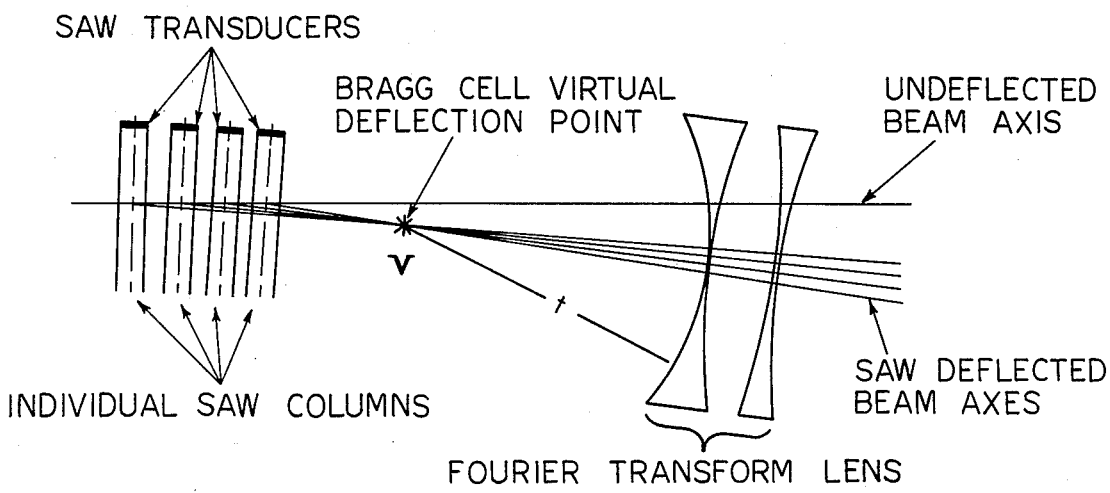
FIG. 6 illustrates the development of a virtual optical beam deflection point produced by a four transducer Bragg Cell of FIG. 2.

A lens design which results from the above considerations is shown in FIG. 5. The optical axis of the lens lies along the axis of a beam deflected by the center frequency of the SAW transducer array. This geometry is allowable since the quality of the focussed, undeflected beam is of no real concern. The design utilizes four refracting surfaces, all of which are circular. In FIG. 5, these surfaces are numbered from $r_1$ to $r_4$ in the order in which they are encountered during operation of the spectrum analyzer. The first surface has a radius of curvature centered, as shown in FIG. 6, on the "virtual" deflection point produced by the transducer array. In FIG. 6 a four-SAW transducer array is depicted along with the deflected beam axis from each transducer. It can be seen from the figure that these beams nearly intersect at the point "V," the location of which depends on the particular Bragg cell design. The fact that point "V" can be displaced from the center of the Bragg Cell allows a relatively short focal length first surface to be fitted into the optical system. Since this surface is concentric with the virtual deflection point, no additional spherical aberrations are introduced for off-axis beam propagation. Surfaces $r_2$ and $r_3$ have radii of curvature that are selected on the basis of optimizing the lens shape factor given the available refractive index ratio. Finally, the radius of lens surface $r_4$ is chosen to minimize the lens focal length yet not introduce excessive aberations.

Figure 7:
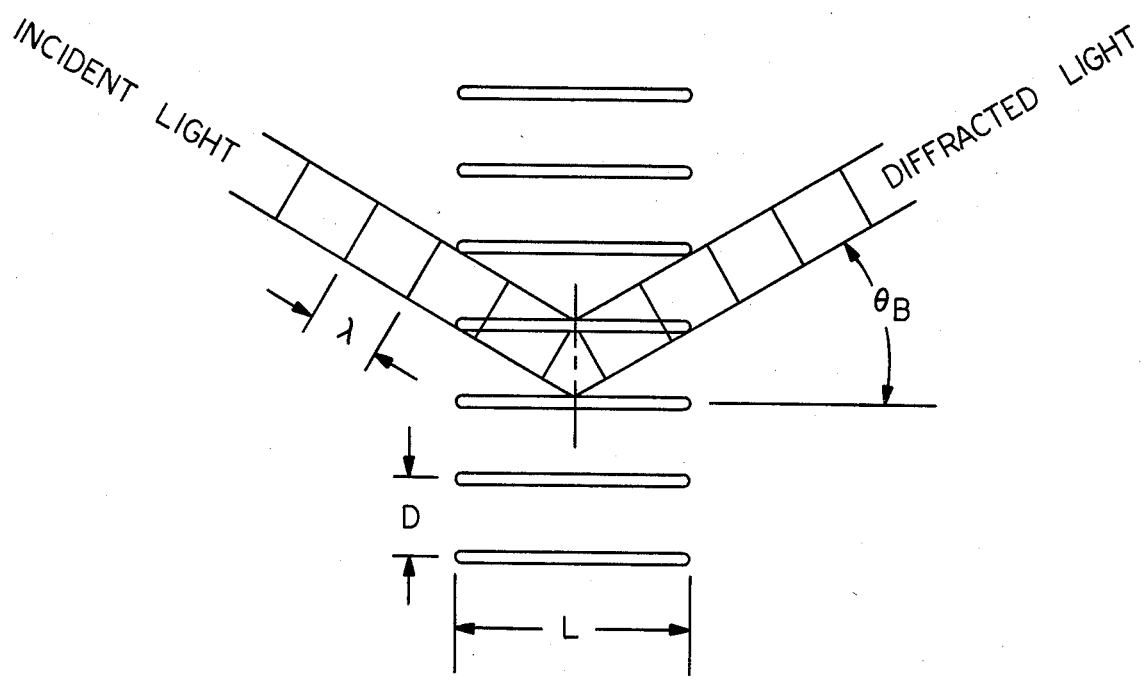
FIG. 7 illustrates Bragg diffraction of light by a grating.

The spectrum analyzer's interferometer is formed by the three Bragg diffraction gratings shown in FIG. 2. Each Bragg diffraction grating consists of a section of periodically loaded optical waveguide within which a guided light beam is coherently Bragg scattered. Referring to FIG. 7, the Bragg Scattering angle is given by $$\theta_B = \sin^{-1}(\lambda/2D, \quad (3)$$

where $\lambda$ is the guided-mode optical wavelength and D is the period of the grating.

The diffraction efficiency of the grating is given by $$\eta = \left(\frac{\kappa L}{2}\right)^2 \left\{\frac{\sin\left[\left(\frac{\kappa L}{2}\right)^2 + \left(\frac{\Delta K L}{2}\right)^2\right]^{\frac{1}{2}}}{\left[\left(\frac{\kappa L}{2}\right)^2 + \left(\frac{\Delta K L}{2}\right)^2\right]^{\frac{1}{2}}}\right\}^2, \quad (4)$$

where $\kappa$ is the grating coupling coefficient and L is the width of the grating. $\Delta K$ in Equation (4) represents possible momentum mismatch in the direction parallel to the grating grooves and is given by $$\Delta K = (4\pi/\lambda)\cdot\sin\theta_B\cdot\Delta\theta, \quad (5)$$

Where $\Delta\theta$ is the difference between the Bragg angle and the angle of incidence, and $\theta_B$ is the Bragg scattering angle. Finally, the grating Q is given by $$Q = \frac{2\pi\lambda L}{D^2} \geq 10, \quad (6)$$

where the inequality in Equation (6) insures that the interaction is in the Bragg regime.

An excellent discussion of the dynamic ranges of both interferometric and non-interferometric (power) spectrum analyzers is given by Shah in "Wideband, Interferometric Spectrum Analyzer," Final Report number AFWAL-TR-81-1158, (1981).

By defining the dynamic range as the ratio of the maximum optical power impinging on a detector to the detector NEP (where the maximum optical power is determined by equating the worst-case third-order IM products resulting from the inherently nonlinear acousto-optic interaction to the detector NEP), the following is calculated:

$$D.R. \text{ (interferometric)} = 2 \times D.R. \text{ (power)} - \tfrac{1}{2} 10 \log\left(\frac{N.R.S.}{\eta_R}\right) - 4.60 \quad (7)$$

Where
- D.R.=Dynamic range (in dB),
- $\eta_r$=Reference Bragg Cell diffraction efficiency,
- N.R.S.=Number of resolvable spots in the Fourier transform plane, and it has been assumed that the laser power, optical throughput losses, and detector NEP for both types of devices are the same. For example, if N.R.S.=100 and $\eta_r$=10% then, $$D.R.(\text{interferometric}) = 2 \times D.R.(\text{power}) - 14.60 \text{ dB}.$$

The above calculations are based on two qualifying assumptions: first, that the total system noise is dominated by the detector Nep (This condition may not be satisfied in the power spectrum analyzer where light scattered from the undeflected beam adds to the background noise level.) and, second, that the IM products resulting from the nonlinearity of the Bragg interaction are dominant compared to the acoustic nonlinearity of the $LiNbO_3$. Within the framework of these assumptions, the dynamic range of the power spectrum analyzer depends only on laser output power, detector NEP, and system optical losses. The operation of the invention proceeds as follows:

(1) The butt-coupled, single-mode GaAlAs laser excites the $TE_o$ mode of the TIPE waveguide.

(2) The diverging, waveguided laser beam is collimated by the homogeneous refractive index lens.

(3) The collimated laser beam encounters a grating beam splitter which deflects half of the optical power through an angle of $2\theta_B$, thereby creating two beams which propagate through the two arms of a Mach-Zender interferometer. (The arm containing the undeflected beam is henceforth referred to as the signal arm and the arm containing the deflected beam is henceforth referred to as the reference arm.)

(4) The signal and reference beams are redirected by a grating beam deflector to pass though the signal and reference Bragg cells and then become incident on the grating beam combiner which closes the interferometer.

(5) The signal beam, which emerges from the grating beam deflector impinges on the traveling strain field generated by the signal Bragg cell SAW transducer. Since the SAW transducer is driven by the time-varying signal whose spectral decompositions is desired, its associated strain field mirrors spatially the temporal variations of the time-varying signal, with each temporal frequency component of the latter corresponding to a spatial frequency component of the former.

(6) Each spatial frequency component of the SAW-generated strain field frequency shifts and deflects a fraction of the signal beam through an angle determined by satisfaction of the Bragg scattering condition (the strength of the acousto-optic interaction being limited so that no more than approximately one percent of the signal beam is deflected by any single frequency component of the strain field).

(7) The acousto-optically deflected signal-beam components are focussed onto the channel waveguide fanout by the Fourier transform lens, the position of a given focussed spot being dependent on the angle through which the corresponding beam component was deflected and, hence, on the frequency of the particular SAW component which caused the deflection. The optical power focussed on a given channel is then proportional to the power level of the corresponding frequency component present in the original RF signal.

(8) The reference beam, which emerges from the grating beam deflector, is spatially and temporally modulated by the reference Bragg cell and, after passage through the beam combiner, focussed onto the channel waveguide fanout by the Fourier transform lens. By driving the reference Bragg cell with an appropriate, periodic linear chirp and by orienting the beam combiner in such a way that the Fourier-transformed reference beam is spatially translated with respect to the Fourier-transformed signal beam, an array of local oscillator "spots" is superimposed over the Fourier-transformed signal beam.

(9) The superimposed reference and signal beam light distributions are combined at the entrance to the channel waveguide fanout and caused to impinge upon the elements of the photodetector array. As a consequence of its square-law nature, each element of the array mixes the reference and signal optical frequencies and generates an electrical signal whose frequency is proportional to the translational offset and whose amplitude is proportional to the amplitude of frequency component of the Fourier-transformed signal input.

What is claimed is:

1. An integrated acousto-optic spectrum analyzer for analyzing the frequency spectrum of a time-varying signal comprising:
   a substrate having a surface planar waveguide formed along one of its surfaces,
   means for providing a collimated beam of optical radiation within the surface planar waveguide,
   grating means formed in the waveguide for splitting the collimated beam into first and second parts,
   grating means formed in the waveguide for deflecting the first and seconds part of the collimated beam,
   a first surface wave modulator means for generating a first surface acoustic wave on the surface of the substrate and for modulating the first part of the split collimated beam, the first surface wave modulation means being responsive to the time-varying signal whose spectral analysis is desired,
   a second surface wave modulator means for generating a second surface acoustic wave on the surface of the substrate and for modulating the second part of the split collimated beam by the second surface wave modulator means being responsive to a time-varying reference signal,
   grating means formed in the waveguide for combining the first and second parts of the collimated beam after the first and second parts have been modulated by the first and second surface acoustic waves respectively,
   Fourier transformer means formed in the waveguide for transforming the combined first and second parts of the collimated beam, an array of detectors coupled to the surface planar waveguide and located so as to receive and detect segments of the Fourier transformed, combined first and second parts of the collimated beam.

2. The device described in claim 1 and further comprising waveguide fan-out means located between the Fourier transformer means and the array of detectors for fanning out the segments of the Fourier transformed, combined first and second parts of the collimated beam.

3. The device described in claim 1 wherein the collimated source means comprises a laser for generating optical radiation and a collimating lens located in the planar waveguide which collimating lens collimates the optical radiation.

4. The device of claim 1 wherein the first surface wave modulator means comprises a plurality of surface acoustic wave transducers tuned to the frequency spectrum over which the time-varying signal is to be analyzed and the second surface wave modulator means comprises a plurality of surface acoustic wave transducers also tuned to the frequency spectrum over which the time-varying signal is to be analyzed.

* * * * *